US012787236B2

(12) United States Patent
Sun et al.

(10) Patent No.: US 12,787,236 B2
(45) Date of Patent: Nov. 3, 2026

(54) ELECTROMAGNETIC INTERFERENCE SHIELDING FOR CAMERA

(71) Applicant: Meta Platforms Technologies, LLC, Menlo Park, CA (US)

(72) Inventors: Amber Sun, Sunnyvale, CA (US); Alan Kleiman Shwarsctein, Saratoga, CA (US); Chien-Ming Nieh, Palo Alto, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 50 days.

(21) Appl. No.: 18/633,036

(22) Filed: Apr. 11, 2024

(65) Prior Publication Data

US 2024/0349468 A1 Oct. 17, 2024

Related U.S. Application Data

(60) Provisional application No. 63/459,152, filed on Apr. 13, 2023.

(51) Int. Cl.

| | |
|---|---|
| ***H05K 9/00*** | (2006.01) |
| ***G02B 5/00*** | (2006.01) |
| ***H04N 23/52*** | (2023.01) |
| ***H04N 23/54*** | (2023.01) |
| ***H04N 23/75*** | (2023.01) |

(52) U.S. Cl.

CPC ........... *H05K 9/0058* (2013.01); *H04N 23/52* (2023.01); *H04N 23/54* (2023.01); *G02B 5/003* (2013.01); *H04N 23/75* (2023.01)

(58) Field of Classification Search

CPC ........ G02B 5/003; H04N 23/52; H04N 23/54; H04N 23/55; H04N 23/57; H04N 23/75; H05K 9/0058

See application file for complete search history.

(56) References Cited

U.S. PATENT DOCUMENTS

| | | | | |
|---|---|---|---|---|
| 11,796,799 | B2 * | 10/2023 | Border | G02B 26/0833 |
| 2012/0155854 | A1 * | 6/2012 | Huang | G03B 17/02 29/592.1 |
| 2014/0043519 | A1 * | 2/2014 | Azuma | G02B 7/09 359/823 |
| 2014/0184899 | A1 * | 7/2014 | McKinley | G03B 5/00 348/373 |
| 2016/0241761 | A1 * | 8/2016 | Garcia | H04N 23/57 |
| 2019/0068850 | A1 * | 2/2019 | Peper, Jr. | H04N 23/54 |

(Continued)

OTHER PUBLICATIONS

Co-pending U.S. Appl. No. 18/379,041, inventors Sun; Amber et al., filed Oct. 11, 2023.

*Primary Examiner* — Amy R Hsu

(74) *Attorney, Agent, or Firm* — FREESTONE INTELLECTUAL PROPERTY LAW PLLC; Aaron J. Visbeek

(57) ABSTRACT

A camera module includes a printed circuit, an image sensor, a lens assembly, and a multi-layer shield. The lens assembly is configured to focus image light to the image sensor. The multi-layer shield is disposed around the lens assembly and around the image sensor. The multi-layer shield includes a shield layer and a light-blocking layer. The shielding layer is configured to block electromagnetic interference (EMI). The light-blocking layer is configured to block ambient light from becoming incident on the image sensor and the lens assembly.

20 Claims, 15 Drawing Sheets

(56) References Cited

U.S. PATENT DOCUMENTS

| | | | | |
|---|---|---|---|---|
| 2019/0250312 | A1* | 8/2019 | Moon | G03B 3/10 |
| 2019/0312072 | A1* | 10/2019 | Cho | G02B 5/003 |
| 2021/0191114 | A1* | 6/2021 | Border | G02B 26/0833 |
| 2022/0232148 | A1* | 7/2022 | Song | G02B 1/002 |
| 2022/0385796 | A1* | 12/2022 | Tam | H04N 23/57 |
| 2023/0262307 | A1* | 8/2023 | Zhan | G02B 13/0015 348/335 |
| 2024/0190340 | A1* | 6/2024 | Shiau | A61L 2/10 |

* cited by examiner

ELECTROMAGNETIC INTERFERENCE SHIELDING FOR CAMERA

CROSS-REFERENCE TO RELATED APPLICATIONS

This application claims priority to U.S. provisional Application No. 63/459,152 filed Apr. 13, 2023, which is hereby incorporated by reference.

TECHNICAL FIELD

This disclosure relates generally to optics, and in particular to cameras.

BACKGROUND INFORMATION

Cameras have become ubiquitous as they are placed in an increasing number of devices such as smartphones, tablets, watches, and action cameras. Resolution, dynamic range, signal quality, and image acquisition time are key performance metrics for cameras and the image sensors that are included in cameras. As cameras get smaller to be included in additional contexts and use-cases, some or all of these performance metrics become more difficult to meet.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1:
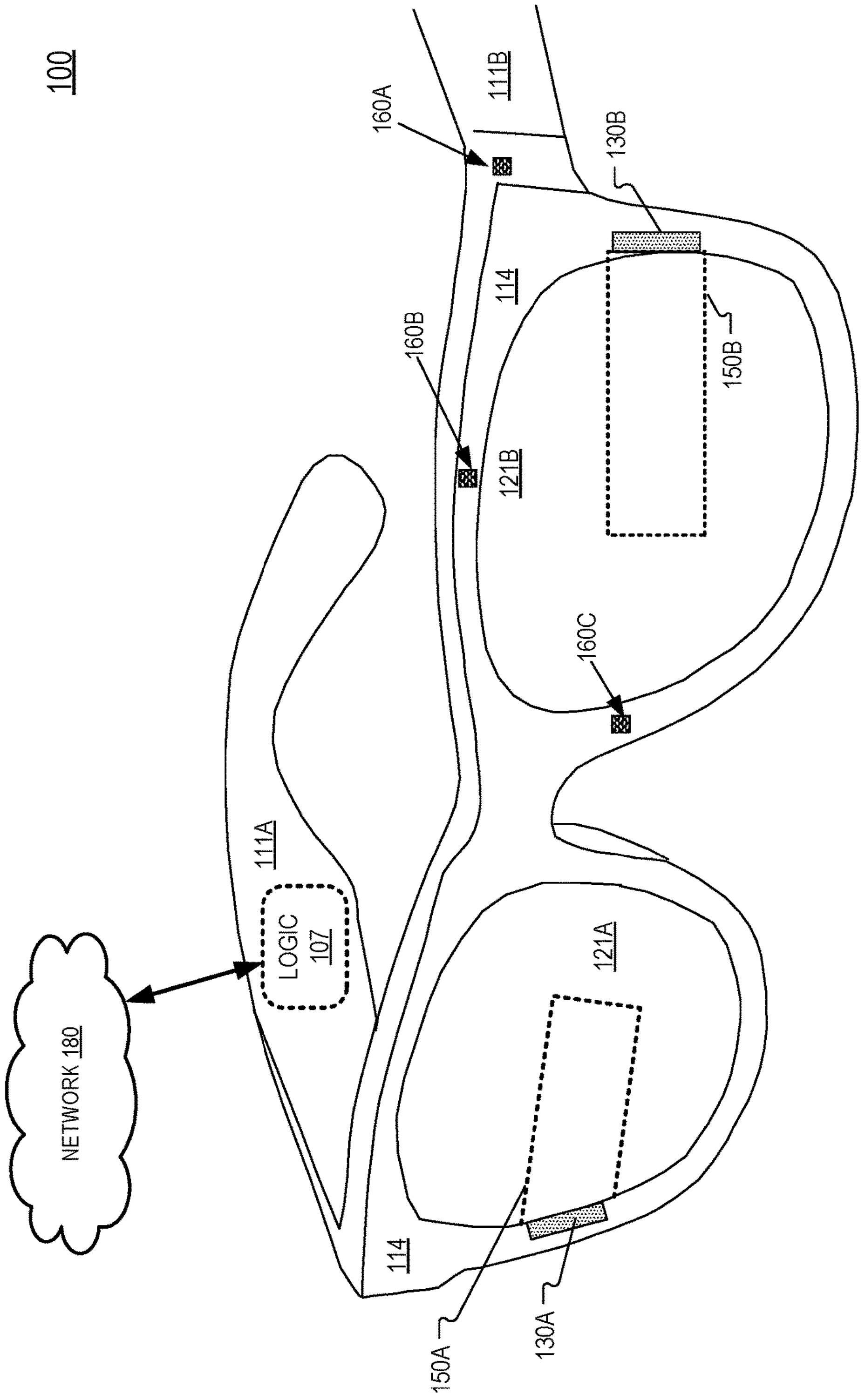
FIG. 1 illustrates a head-mounted display (HMD) that may include a camera module with EMI shielding, in accordance with aspects of the disclosure.

Embodiments of electromagnetic interference shielding for cameras are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In some implementations of the disclosure, the term "near-eye" may be defined as including an element that is configured to be placed within 50 mm of an eye of a user while a near-eye device is being utilized. Therefore, a "near-eye optical element" or a "near-eye system" would include one or more elements configured to be placed within 50 mm of the eye of the user.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.6 μm.

In aspects of this disclosure, the term "transparent" may be defined as having greater than 90% transmission of light. In some aspects, the term "transparent" may be defined as a material having greater than 90% transmission of visible light.

Current shielding technology for image sensors includes using metal cowling or a metal shielding can as a shield for at least two reasons. The first reason is to protect an image sensor from electromagnetic interference (EMI). EMI can influence the image charge measured by each pixel in an image sensor and thus impact the signal quality of acquired images. EMI can also potentially damage transistors included in image sensors or peripheral electronics that support a camera module. The second reason is to protect wireless radio receivers from EMI noise of an image sensor. EMI coupling to radio frequency (RF) receivers through either antenna or cables can degrade wireless communication distance and throughput. Metal cowling or shield cans that are added to a camera module add bulk which increases the footprint of a camera module and thus limits the contexts that the camera modules can be deployed in. In particular, printed circuits such as flexible circuits or printed circuit boards (PCBs), are limited in real estate to support adding metal cowlings or shielding cans while still fitting in certain devices. The metal cowling or shield cowls also add weight to a camera module.

In implementations of the disclosure, an EMI shield is applied to a lens assembly of a camera module. The lens assembly may be a barrel-less lens assembly to further reduce the size of a camera module. The EMI shield may be a multi-layer shield that serves to both block EMI and block ambient light from reaching the lens assembly and an image sensor that receives image light. In implementations of this disclosure, ambient light may include ultraviolet light, visible light, and/or infrared light. In implementations of the disclosure, an antenna is included in a wearable device. The antenna may be utilized for wireless communication, for example. In implementations of the disclosure, the camera module is included in a head-mounted device. The proximity of the antenna in the wearable device (such as a head-mounted device) may make a wireless receiver particularly susceptible to the negative effects of EMI from a camera sensor. Furthermore, reducing weight in a camera module may be particularly important for including the camera module in a wearable device. Therefore, the disclosed EMI shield may reduce the size of a camera module and reduce the size of the camera module while effectively shielding the sensor of the camera module from EMI. These and other embodiments are described in more detail in connection with FIGS. 1-6C.

FIG. 1 illustrates a head-mounted display (HMD) 100 that may include a camera module with EMI shielding, in accordance with aspects of the present disclosure. Embodiments of the disclosure may also be utilized in other contexts or devices that can benefit from cameras with EMI shielding including head-mounted devices (e.g. smart glasses), watches, or other wearables.

The illustrated example HMD 100 includes a frame 114 coupled to arms 111A and 111B. Lens assemblies 121A and 121B are mounted to frame 114. Lens assemblies 121A and 121B may include a prescription lens matched to a particular user of HMD 100. The illustrated HMD 100 is configured to be worn on or about a head of a wearer of HMD 100.

In the HMD 100 illustrated in FIG. 1, each lens assembly 121A/121B includes a waveguide 150A/150B to direct image light generated by displays 130A/130B to an eyebox area for viewing by a user of HMD 100. Displays 130A/130B may include a beam-scanning display or a liquid crystal on silicon (LCOS) display for directing image light to a wearer of HMD 100 to present virtual images, for example.

Lens assemblies 121A and 121B may appear transparent to a user to facilitate augmented reality or mixed reality to enable a user to view scene light from the environment around them while also receiving image light directed to their eye(s) by, for example, waveguides 150. Lens assemblies 121A and 121B may include two or more optical layers for different functionalities such as display, eye-tracking, and optical power. In some embodiments, image light from display 130A or 130B is only directed into one eye of the wearer of HMD 100. In an embodiment, both displays 130A and 130B are used to direct image light into waveguides 150A and 150B, respectively.

Frame 114 and arms 111 may include supporting hardware of HMD 100 such as processing logic 107, a wired and/or wireless data interface for sending and receiving data, graphic processors, and one or more memories for storing data and computer-executable instructions. Processing logic 107 may include circuitry, logic, instructions stored in a machine-readable storage medium, ASIC circuitry, FPGA circuitry, and/or one or more processors. In one embodiment, HMD 100 may be configured to receive wired power. In one embodiment, HMD 100 is configured to be powered by one or more batteries. In one embodiment, HMD 100 may be configured to receive wired data including video data via a wired communication channel. In one embodiment, HMD 100 is configured to receive wireless data including video data via a wireless communication channel. Processing logic 107 may be communicatively coupled to a network 180 to provide data to network 180 and/or access data within network 180. The communication channel between processing logic 107 and network 180 may be wired or wireless.

In the illustrated implementation of FIG. 1, HMD 100 includes cameras 160A, 160B, and 160C (collectively referred to as cameras 160). Cameras 160 may be placed in space-constrained locations such as the temple area, nasal area, and top of the frame 114. Additional cameras 160 may be placed in various regions of HMD 100. Cameras 160 may be configured to image an external environment (e.g. scene facing), image an eyebox region that includes an eye of a user of HMD 100, or image for hand or face gestures made by a user. In some implementations, an illumination module may illuminate regions (e.g. eyebox region, face, or hands) with near-infrared illumination light to assist one or more cameras 160 in imaging for eye-tracking purposes or gesture-tracking purposes. Cameras 160 may include a lens assembly configured to focus image light to a complementary metal-oxide semiconductor (CMOS) image sensor, in some implementations. A near-infrared filter that receives a narrow-band near-infrared wavelength may be placed over the image sensor so it is sensitive to the narrow-band near-infrared wavelength while rejecting visible light and wavelengths outside the narrow-band. Near-infrared illuminators (not illustrated) such as near-infrared LEDs or lasers that emit the narrow-band wavelength may be included in the illumination module to illuminate the various regions with the narrow-band near-infrared wavelength.

Figure 2A:
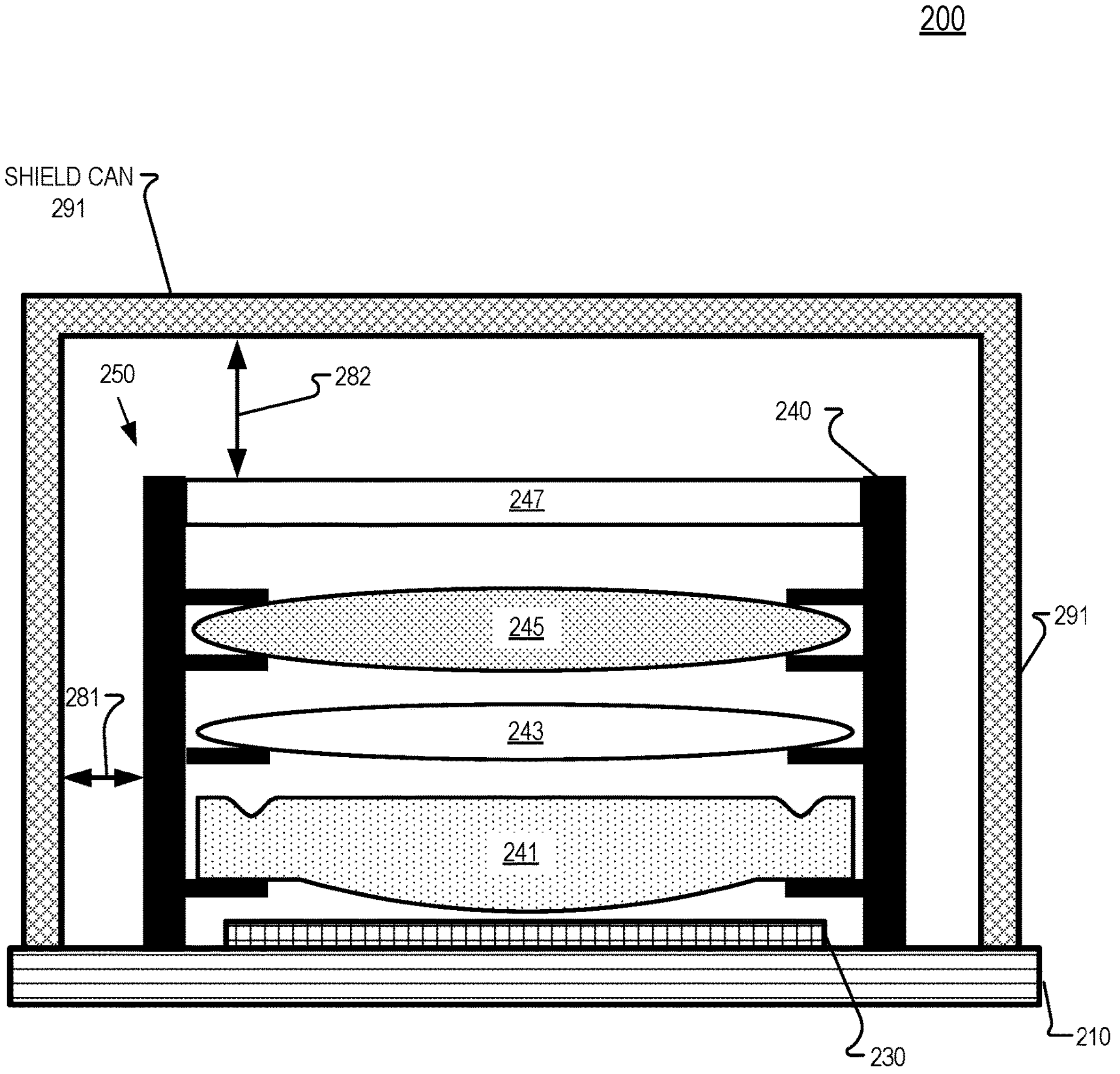
FIG. 2A shows a side view of an example camera module that includes a barreled lens assembly, an image sensor, and a metal shield can.

FIG. 2A shows a side view of example camera module 200 that includes a barreled lens assembly 250, an image sensor 230, and a metal shield can 291. Lens assembly 250 includes example lens elements 241, 243, 245, and 247 supported and protected by a conventional barreled lens housing 240. Barreled lens housing 240 is typically a black plastic structure. Lens elements 241, 243, 245, and 247 may be filters or refractive or diffractive lenses with optical power that focus image light to image sensor 230. Image sensor 230 is disposed on a printed circuit 210, in FIG. 2A.

Shield can 291 surrounds barreled lens assembly 250 and image sensor 230 to protect the image sensor 230 from EMI. Shield can 291 may be formed of stamped or laser cut shield metal that is folded into a three-dimensional shape of shield can 291. Although not shown in the side view of camera module 200, a top void in shield can 291 may provide an aperture for image light to propagate through to barreled lens assembly 250 to be focused on image sensor 230. FIG. 2A shows that side tolerance 281 and top tolerance 282 need to be accounted for in assembly processes when the shield can 291 is placed to surround barreled lens assembly 250 and image sensor 230. Thus, the assembly and manufacturing tolerances 281 and 282 also add to the overall bulk and size of camera module 200.

Figure 2B:
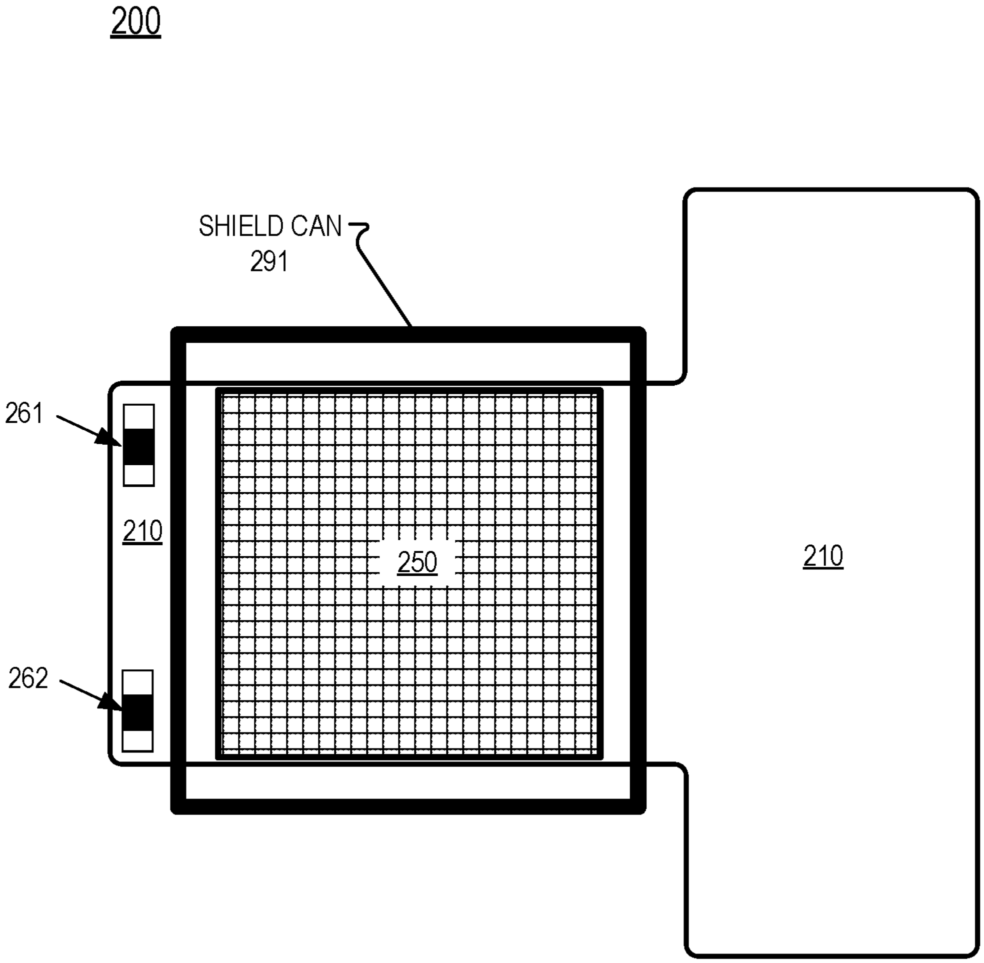
FIG. 2B illustrates a plan view of camera module that shows a barreled lens assembly disposed of on a printed circuit.

FIG. 2B illustrates a plan view of camera module 200 that shows barreled lens assembly 250 disposed on the printed circuit 210. Electrical components 261 and 262 (e.g. capacitors or resistors) that support components of camera module 200 may also be disposed of on printed circuit 210. FIG. 2B shows that there is not sufficient space on printed circuit 210 to use shield can 291. Thus, a miniaturized solution for EMI shielding would allow for a smaller camera module.

Figure 3A:
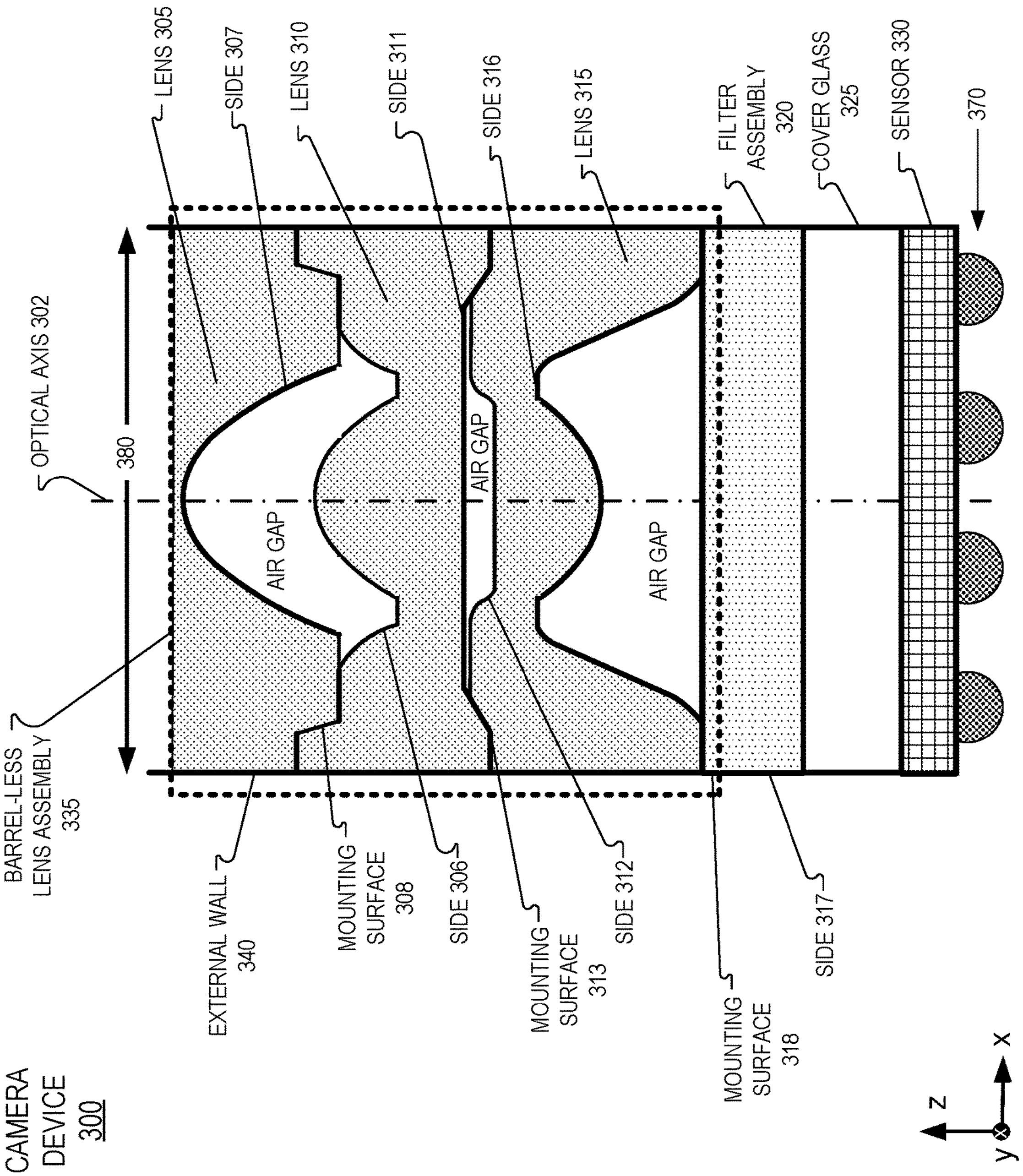
FIG. 3A illustrates a cross section of a camera device having a barrel-less lens assembly, in accordance with aspects of the disclosure.

FIG. 3A illustrates a cross section of a camera device 300 having a barrel-less lens assembly 335, in accordance with aspects of the disclosure. Camera device 300 is illustrated in an upward (vertical) posture. The camera device 300 may capture data (e.g., one or more images) of a local area surrounding an electronic wearable device that integrates the camera device 300. The camera device 300 may be an embodiment of cameras 160A, 160B, or 160C, for example. The example camera device 300 includes a lens 305, a lens 310, a lens 315, a filter assembly 320, a sensor cover glass 325, and a sensor 330. The lenses 305, 310, and 315 may be positioned in optical series along an optical axis 302 and form barrel-less lens assembly 335 to focus image light (received through aperture 380) to sensor 330. In some embodiments of the disclosure, wafer level optics (WLO) or inject-molding lenses over an image sensor (not specifically illustrated) form a barrel-less lens assembly. In one or more embodiments, the barrel-less lens assembly 335 includes only the lenses 305 and 310, i.e., in such cases, the lens 315 is not assembled within the barrel-less lens assembly 335 and the camera device 300. Each of the lenses 305, 310, 315 may be of a rectangular shape, cubic shape, round shape, prism shape, freeform shape, or some other shape. Hence, each of the lenses 305, 310, 315 may not be limited to a rectangular shape or cubic shape with 90 degrees angles between edges. Furthermore, each of the lenses 305, 310, 315 may be made of various suitable materials not limited to plastic or glass.

In some embodiments, the camera device 300 may also include a controller (not shown in FIG. 3A). In other embodiments, the controller may be part of some other system (e.g., a smartwatch or headset the camera device 300 is coupled to). In alternative configurations, different and/or additional components may be included in the camera device 300. The upward (vertical) posture of the camera device 300 corresponds to a posture of the camera device 300 where the optical axis 302 is substantially parallel to gravity. On the other hand, a forward (horizontal) posture of the camera device 300 corresponds to a posture of the camera device 300 where the optical axis 302 is substantially orthogonal to gravity.

The barrel-less lens assembly 335 is a stationary structure that uses the lenses 305, 310, and 315 to focus light from a local area to a target area. The target area may include the sensor 330 for capturing the light from the local area. Sensor 330 may include electrically conductive contacts 370 for electrically connecting sensor 330 to a printed circuit. The lenses 305, 310 and 315 of the barrel-less lens assembly 335 may have a fixed (i.e., frozen) vertical position (e.g., along z direction). The lens 305 may include a side 306 and a side 307 that is opposite to the side 306, and the side 306 may include a mounting surface 308. The lens 310 may include a side 311 and a side 312 that is opposite to the side 311. The side 312 may include a mounting surface 313 that is directly affixed to the mounting surface 308 to form at least a portion of the barrel-less lens assembly 335 comprising the lens 305 and the lens 310 in optical series. The mounting surface 313 may be directly affixed to the mounting surface 308 via an interlocking mechanism of the mounting surface 313. Furthermore (e.g., to further enhance coupling between the lens 310 and the lens 305), an adhesive (e.g., glue) may be applied between the lens 305 and the lens 310, and not only limited to the mounting surface 313 with the interlocking mechanism. The lens 315 may include a side 316 and a side 317 that is opposite to the side 316. The side 317 may include a mounting surface 318 that is directly affixed to the mounting surface 313 to form the barrel-less lens assembly 335 comprising the lenses 305, 310, 315 in optical series. The mounting surface 318 may be directly affixed to the mounting surface 313 an interlocking mechanism of the mounting surface 318. Furthermore (e.g., to further enhance coupling between the lens 315 and the lens 310), an adhesive (e.g., glue) may be applied between the lens 310 and the lens 315, and not only limited to the mounting surface 318 with the interlocking mechanism.

In one or more embodiments, an external wall 340 of the barrel-less lens assembly 335 is coated with one or more protective coating layers. The one or more protective coating layers may include one or more layers of visible and near infrared non-transparent coating (e.g., black ink coating). The visible and near infrared non-transparent coating may be applied to the external wall 340 of the barrel-less lens assembly 335 to block undesired light (e.g., visible and near infrared light) from outside of the camera device 300 to propagate through the external wall 340 and reach components of the barrel-less lens assembly 335 causing stray light and/or flare. An EMI shield coating may be applied to external wall 340, in accordance with embodiments of the disclosure. In an implementation, a multi-layer shield layer that includes a shielding layer to block EMI may be applied to external wall 340. Without a conventional plastic lens assembly around lens elements (such as lens assembly 250 in FIG. 2A) the self-supporting lenses of barrel-less lens assembly 335 reduces dimensions of the camera device 300 along the x axis and the y axis.

As the barrel-less lens assembly 335 is a self-supporting structure that does not include a lens barrel or lens holder, the function of lens barrel or lens holder in blocking the undesired light is instead performed by the one or more protective coating layers and/or shielding layers applied to the external wall 340 of the barrel-less lens assembly 335. The shielding layer may be applied to the external wall 340 of the barrel-less lens assembly 335 to protect internal components of the camera device 300 from electro-magnetic radiation from other components of an electronic device that integrates the camera device 300, for example.

The barrel-less lens assembly 335 thus represents a self-supporting structure fixed in place within the camera device 300 that includes multiple lenses positioned in optical series and aligned along the optical axis 302. A corresponding interlock structure incorporated at each of the mounting surfaces 313 and 318 (i.e., lens flanges) may be employed to achieve a preferred level of lens centering and tilt control. An adhesive (e.g., glue) may be applied at each mounting surface 313, 318 to further enhance the corresponding interlock structure and affix the corresponding lens 310, 315 together within the barrel-less lens assembly 335. The barrel-less lens assembly 335 may be further affixed via an adhesive (e.g., glue) to a top side of the filter assembly 320. Alternatively, the camera device 300 may not include the filter assembly 320.

The filter assembly 320 may filter light coming from the barrel-less lens assembly 335 before reaching the sensor 330. The filter assembly 320 may include one or more filters, such as: an infrared cut-off filter (IRCF), an infrared pass filter (IRPF), one or more other color filters, a micro lens positioned over each pixel of the sensor 330, some other device for filtering light, or some combination thereof. The IRCF is a filter configured to block the infrared light and the ultraviolet light from the local area and propagate the visible light to the sensor 330. The IRPF is a filter configured to block the visible light from the local area and propagate the infrared light and the ultraviolet light to the sensor 330. The filter assembly 320 may be placed on a top surface of the sensor cover glass 325. The sensor cover glass 325 may be placed on top of the sensor 330 to protect the sensor 330 from a pressing force generated from weights of the barrel-less lens assembly 335 and the filter assembly 320. The sensor cover glass 325 may be made of glass or some other suitable material that propagates light from the filter assembly 320 to the sensor 330. Lens assembly 335 can also be put on the sensor 330 directly without standing on the filter 320 and/or cover glass 325. In other words, the sensor may be chip-scale package (CSP), chip-on-board (COB), or RW package type.

The sensor 330 may detect image light received by the camera device 300 from the local area that passes through the lenses 305, 310, 315 of the barrel-less lens assembly 335. The sensor 330 may also be referred to as an "image sensor." The sensor 330 may be, e.g., a CMOS sensor, a CCD sensor, some other device for detecting light, or some combination thereof. Data (e.g., images) captured by the sensor 330 may be provided to a controller of the camera device 300 or to some other controller (e.g., image signal processor, not shown in FIG. 3A). The sensor 330 may include one or more individual sensors, e.g., a photodetector, a CMOS sensor, a CCD sensor, a pixel, some other device for detecting light, or some combination thereof. The individual sensors may be in an array. The sensor 330 may capture visible light and/or infrared light from the local area. The visible and/or infrared light may be focused from the local area to the sensor 330 via the barrel-less lens assembly 335. The sensor 330 may include various filters, such as an IRCF, IRPF, one or more other color filters, a micro lens on each pixel of the sensor 330, some other device for filtering light, or some combination thereof.

The controller of the camera device 300 (not shown in FIG. 3A) may control the components of the camera device 300. In some embodiments, the controller processes image data captured by the sensor 330. In some other embodiments, instead of the controller of the camera device 300, a different controller outside of the camera device 300 (e.g., image signal processor) is configured to process image data captured by the sensor 330.

In some implementations, cover glass 325 is included in sensor 330. In some implementations, filter assembly 320 is integrated into barrel-less lens assembly 335. In an implementation, filter assembly 320 is disposed between lens 305 and lens 310. In an implementation, filter assembly 320 is disposed between lens 310 and lens 315.

Figure 3B:
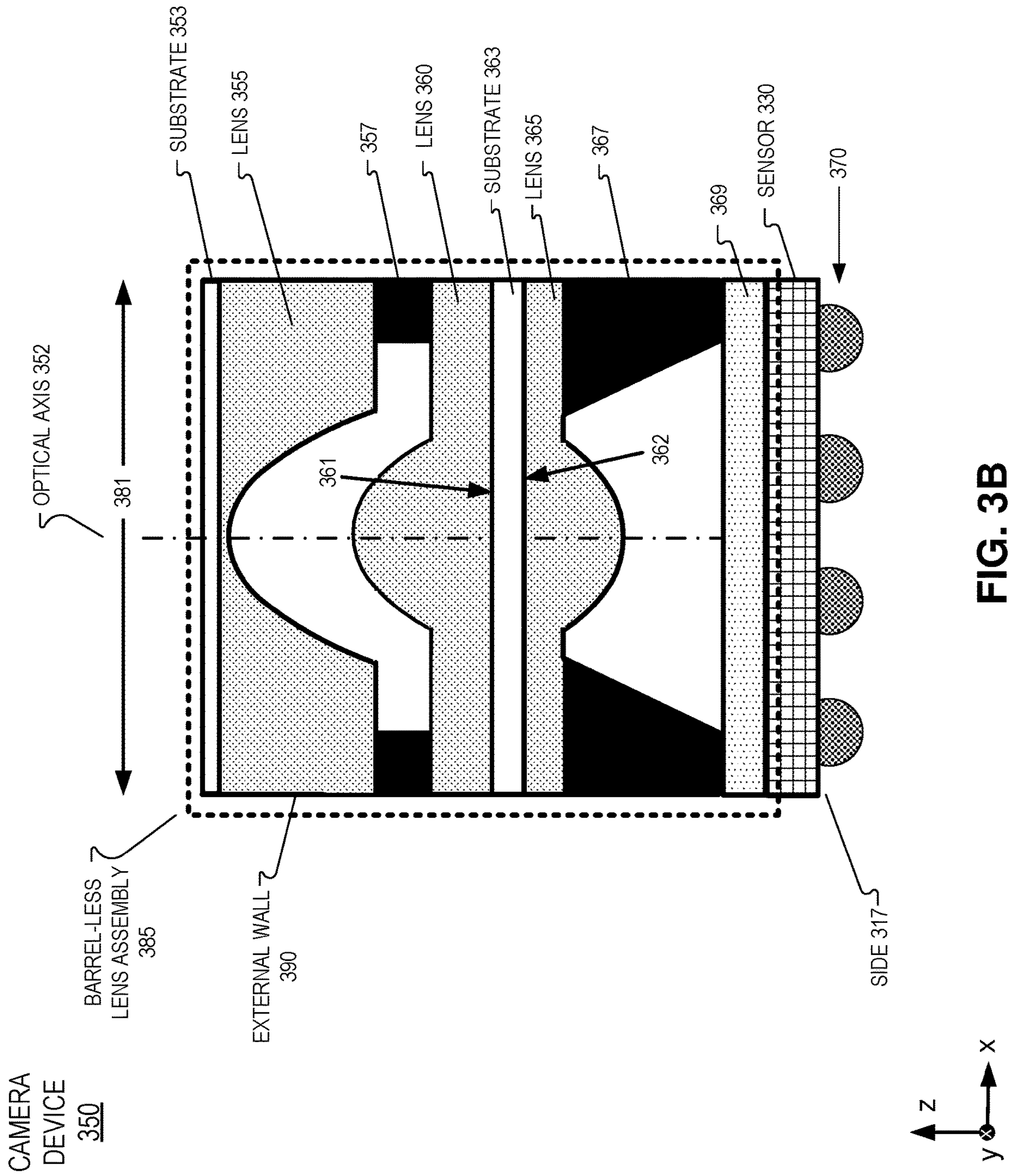
FIG. 3B illustrates a camera device that includes an example barrel-less lens assembly that includes wafer level optics (WLO), in accordance with aspects of the disclosure.

FIG. 3B illustrates a camera device 350 that includes a barrel-less lens assembly 385 that includes wafer level optics (WLO), in accordance with implementations of the disclosure. The camera device 350 may be an embodiment of cameras 160A, 160B, or 160C, for example. Barrel-less lens assembly 385 is configured to focus image light to sensor 330. Barrel-less lens assembly 385 has external walls 390. The WLO in barrel-less lens assembly 385 may include lens 355, lens 360, and lens 365. The lenses 355, 360, and 365 may be positioned in optical series along an optical axis 352 and form barrel-less lens assembly 385 to focus image light (received through aperture 381) to sensor 330. A wafer substrate 353 over lens 365 may be included in barrel-less lens assembly 385. In an implementation wafer substrate 353 has a filter coating on it. The filter coating may be IRCF or infrared bandpass filter (IRBF), for example.

In an implementation, support 367 provides an offset for lens 365 with respect to sensor 330. In FIG. 3B, substrate 363 is disposed between lens 360 and lens 365. Substrate 363 includes a first side 361 opposite a second side 362 of substrate 363. Substrate 363 may be a glass substrate. A filter layer may be a thin film coating disposed on a surface 361 and/or surface 362 of substrate 363. In other implementations, filter layers may be disposed elsewhere in barrel-less lens assembly 385. Filter layers 361 and/or 362 may have the same or similar feature options as described with respect to filter layer 320, in some implementations. Support 357 is disposed between lens 360 and lens 355 to provide an offset between the lenses 355 and 360.

FIG. 3B illustrates layer 369 being disposed between support 367 and sensor 330. In an implementation, layer 369 is a glass cover. In an implementation, layer 369 is a filter layer that may be an IRCF or IRBF filter. While FIGS. 3A and 3B illustrate three lenses, those skilled in the art understand that lens assemblies that include more than three elements may also benefit from the implementations of the disclosure.

Figure 4A:
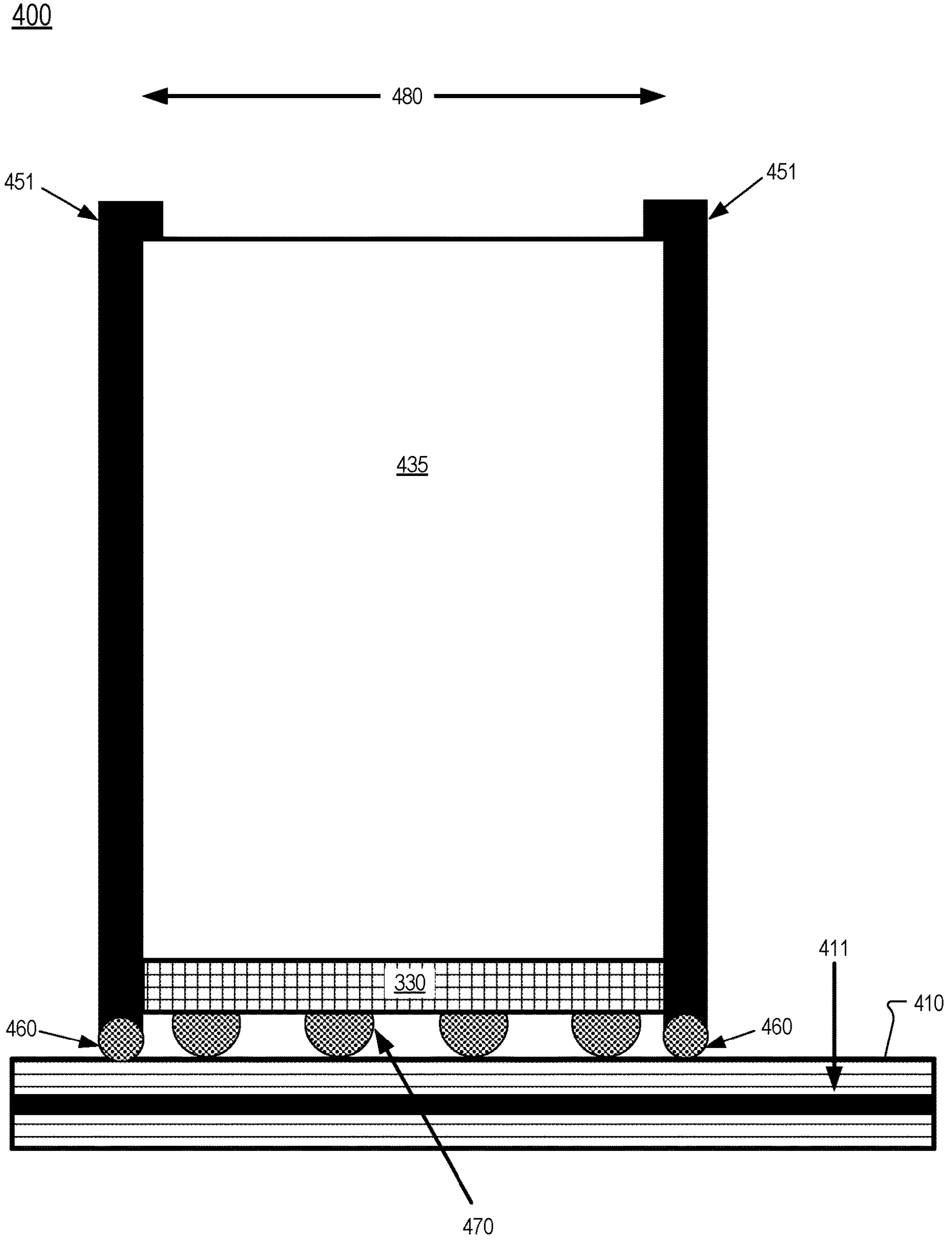
FIG. 4A illustrates a camera module including an EMI shield layer, in accordance with aspects of the disclosure.

FIG. 4A illustrates a camera module 400 including an EMI shielding layer 451, in accordance with aspects of the disclosure. Camera module 400 includes sensor 330 and lens assembly 435. Lens assembly 435 may be a barrel-less assembly such as barrel-less lens assembly 335, in that lens assembly 435 does not include a black plastic housing (lens barrel) to support the various lens elements of lens assembly 435. Lens assembly 435 may include barrel-less lens assembly 335 having external walls 340, in some implementations. Lens assembly 435 may include barrel-less lens assembly 385 having external walls 390, in some implementations. Lens assembly 435 is configured to focus image light to sensor 330.

In FIG. 4A, sensor 330 is electrically coupled to printed circuit 410 via contacts 470. Contacts 470 may be part of a ball grid array. Contacts 470 may be metal. Contacts 470 may be gold-plated. Contacts 470 may be soldered to pads of printed circuit 410. The pads of printed circuit 410 may be copper, in some implementations. Printed circuit 410 may be a rigid printed circuit board (PCB) or a flexible circuit (also known as a "flex circuit"). Printed circuit 410 may include a ground plane 411 as a layer of the printed circuit 410.

In FIG. 4A, EMI shielding layer 451 is applied to external walls of lens assembly 435. In the illustration of FIG. 4A, EMI shielding layer 451 is also applied to the outside of sensor 330. EMI shielding layer 451 is electrically coupled to ground plane 411 of printed circuit 410 to provide a Faraday cage around the sensor 330 to block EMI, in FIG. 4A. EMI shielding layer 451 may be coupled to ground plane 411 with a conductive glue (e.g. epoxy) used as connection 460, in some implementations. EMI shielding layer 451 may be soldered to ground plane 411 for connection 460, in some implementations. While EMI shielding layer 451 may cover a significant portion of camera module 400, aperture 480 is not coated with EMI shielding layer 451 so that image light can still propagate to sensor 330. Aperture 480 may be masked when EMI shielding layer 451 is applied, in some implementations.

EMI shielding layer 451 may be a black coating that is doped with metal for shielding purposes. EMI shielding layer 451 may include conductive black paint where the black paint is doped with nickel, graphite, or copper, for example. The black coating doped with metal may serve a dual purpose of blocking ambient light from reaching sensor 330 while also blocking EMI from affecting the imaging signals generated by sensor 330.

EMI shielding layer 451 may be applied using physical vapor deposition (PVD) techniques, in some implementations. EMI shielding layer 451 may be applied using e-beam techniques, in some implementations. EMI shielding layer 451 may be applied using sputtering techniques, in some implementations.

Figure 4B:
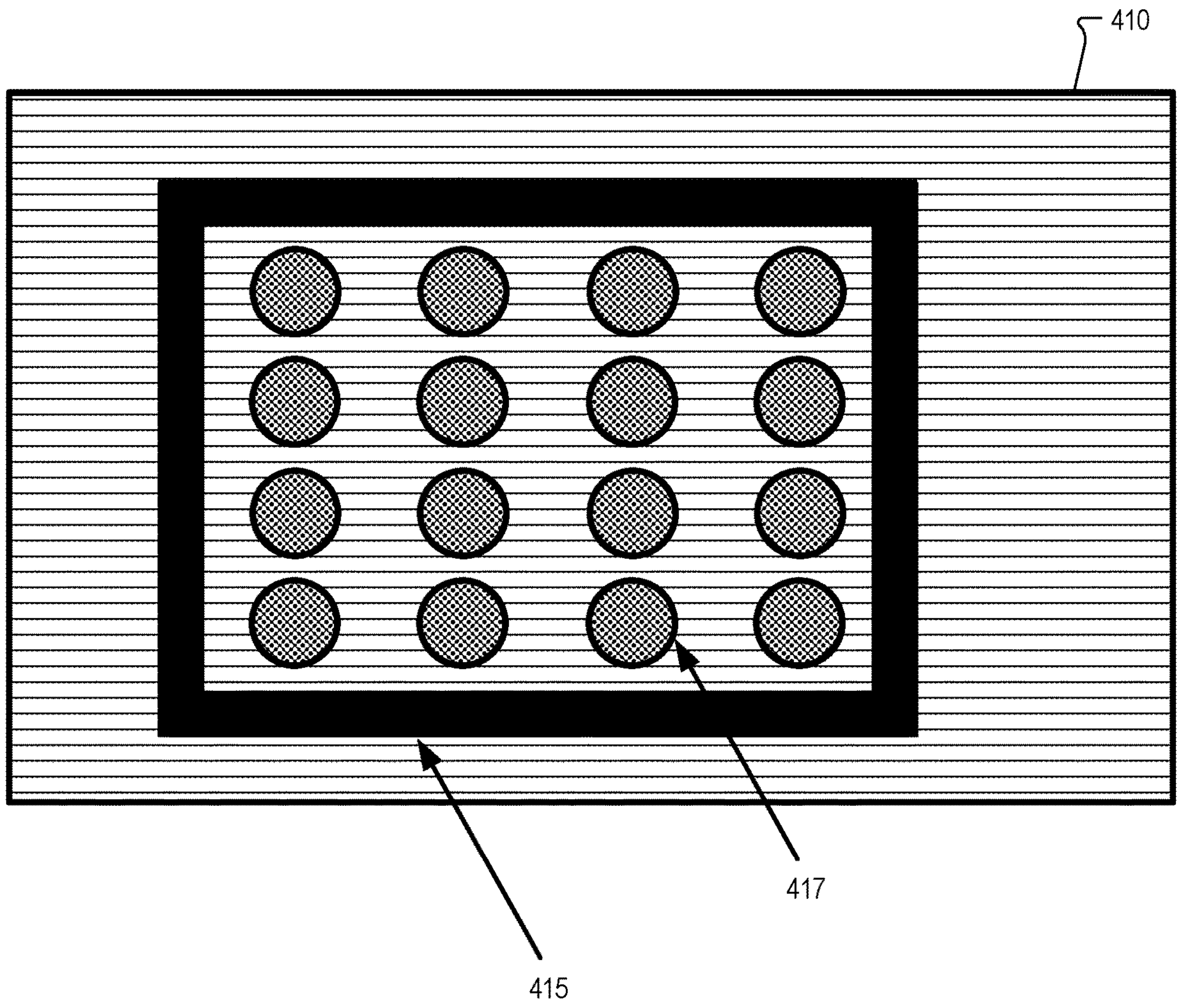
FIG. 4B illustrates a plan view of a portion of a printed circuit, in accordance with aspects of the disclosure.

FIG. 4B illustrates a plan view of a portion of printed circuit 410, in accordance with aspects of the disclosure. Printed circuit 410 includes pads 417 to electrically couple with contacts 470 of sensor 330. Printed circuit 410 also includes a metal track 415 sized to tie in the EMI shielding layer 451. Metal track 415 may be electrically coupled to ground plane 411 of the printed circuit 410. Metal track 415 may form a closed loop to enhance the Faraday cage effect provided by the combination of shielding layer 451, connection 460 (e.g. conductive epoxy), metal track 415, and ground plane 411. Metal track 415 may be formed of copper and EMI shielding layer 451 may be soldered to the copper of metal track 415.

Figure 4C:
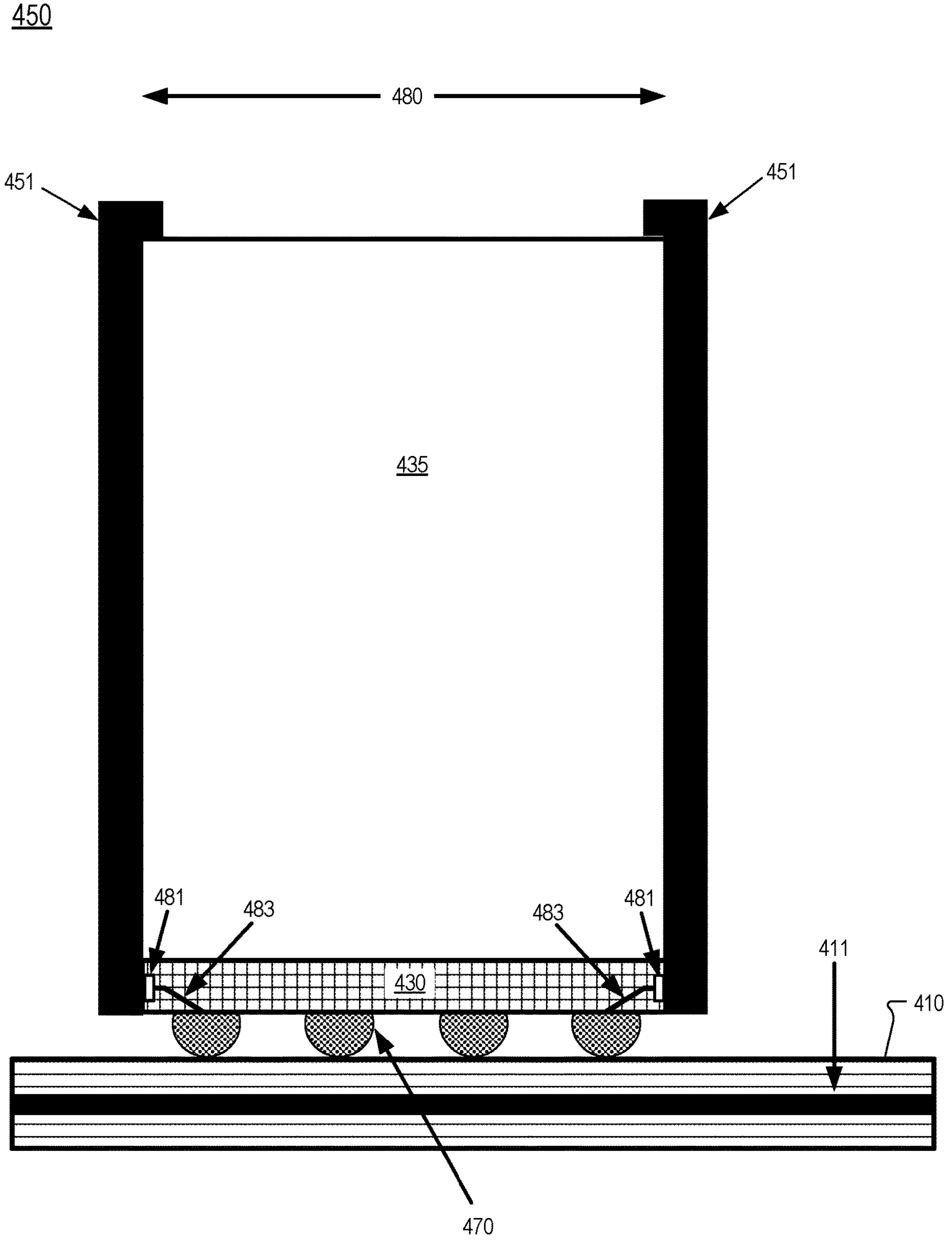
FIG. 4C illustrates a camera module including a shielding layer electrically coupled to a ground plane by way of internal traces and edge plates of an image sensor, in accordance with aspects of the disclosure.

FIG. 4C illustrates a camera module 450 including a shielding layer 451 electrically coupled to ground plane 411 by way of internal traces and edge plates of image sensor 430, in accordance with implementations of the disclosure. FIG. 4C differs from FIG. 4A in that connections 460 are no longer used to couple shielding layer 451 to ground plane 411. Rather, image sensor 430 includes edge plates 481, internal traces 483 and the shielding layer 451 is electrically coupled to ground plane 411 by way of edge plates 481, internal traces 483, and conductive contacts 470 of sensor 430. Edge plates 481 may be contact pads disposed on the exterior of a package of sensor 430 to be electrically connected to shielding layer 451. Internal traces 483 may be copper traces that internally traverse the package of sensor 530 from edge plates 481 to conductive contacts 470 of sensor 430.

Figure 5A:
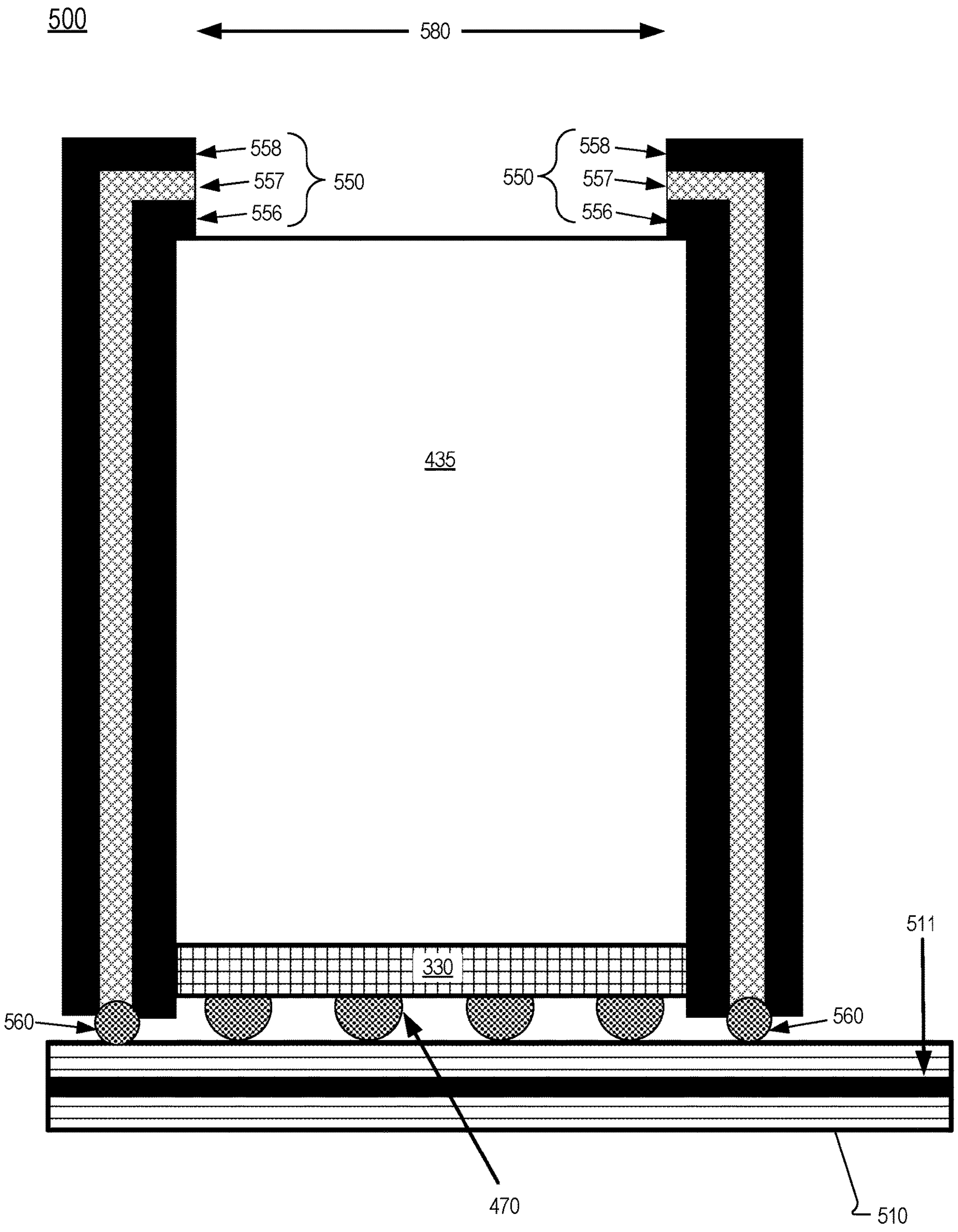
FIG. 5A illustrates a camera module including a multi-layer shield, in accordance with aspects of the disclosure.

FIG. 5A illustrates a camera module 500 including a multi-layer shield 550, in accordance with aspects of the disclosure. Camera module 500 includes sensor 330 and lens assembly 435. Lens assembly 435 may include barrel-less lens assembly 335 having external walls 340, in some implementations. Lens assembly 435 may include barrel-less lens assembly 385 having external walls 390, in some implementations. Lens elements of lens assembly 435 may be self-supporting and a light-blocking layer of multi-layer shield 550 may be be coated directly on the lens elements of lens assembly 435. Lens assembly 435 is configured to focus image light to sensor 330.

In FIG. 5A, sensor 330 is electrically coupled to printed circuit 510 via contacts 470. Contacts 470 may be part of a ball grid array. Contacts 470 may be metal. Contacts 470 may be gold-plated. Contacts 470 may be soldered to pads of printed circuit 510. Contacts 470 may include solder balls. The pads of printed circuit 510 may be copper, in some implementations. Printed circuit 510 may be a rigid printed circuit board (PCB) or a flexible circuit (also known as a “flex circuit”). Printed circuit 510 may include a ground plane 511 as a layer of the printed circuit 510. Contacts 470 may be coupled to ground plane 511 with vias (not specifically illustrated) of printed circuit 510.

In FIG. 5A, multi-layer shield 550 is applied to external walls of lens assembly 435. In the illustration of FIG. 5A, multi-layer shield 550 is also applied to the outside of sensor 330.

Multi-layer shield 550 includes layer 556, 557, and 558, in FIG. 5A. Layer 557 is disposed between layer 556 and layer 558. In an implementation, layer 556 is a black light-blocking layer, layer 557 is a shielding layer configured to block EMI, and layer 558 is a black light-blocking layer. In some implementations, layers 556 and 558 may be considered anti-reflective (AR) coatings. In an implementation, layer 556 is a light-blocking layer and layer 558 is a non-light blocking layer that does not block ambient light.

Light-blocking layer 556 may include black paint to absorb ambient light to prevent ambient light from becoming incident on sensor 330 or lens assembly 435. Black paint may be applied as an electrodeposited coating or using electrophoresis, or electrospray, for example. Light-blocking layer 556 may be configured to block ultraviolet light, visible light, and near-infrared light. Light-blocking layer 556 may include an interference layer that selectively transmits or reflects the ambient light as a mechanism to block ambient light from becoming incident on sensor 330 or lens assembly 435. The interference layer may be tuned to block visible light and/or certain wavelengths of infrared light. The black ink layer can have a varied refractive index to reduce reflected light and improve light absorption.

Shielding layer 557 characteristics impact shielding effectiveness. It may be between 1 micron and 100 microns thick having an electrical conductivity of greater than one million (1e6) siemens per meter (S/m) across frequency of interest.

Shielding layer 557 may include a metal layer. The metal layer may include nickel, silver, stainless steel, indium tin oxide (ITO), and/or fluorine tin oxide (FTO). The metal layer may be formed using physical vapor deposition (PVD) techniques, in some implementations. The metal layer may be applied using e-beam techniques, in some implementations. The metal layer may be applied using sputtering techniques, in some implementations.

Shielding layer 557 may include a conductive paint. The conductive paint may be metal doped paint. Conductive paint may be doped with nickel, graphite, or copper, for example. Acrylic conductive paint may be used for shielding layer 557. The conductive paint may be formed using physical vapor deposition (PVD) techniques, in some implementations. In other embodiments, conductive polymers can be used as shielding layer 557. The conductive polymers can be transparent or have a filler material to block light or increase conductivity.

Shielding layer 557 is electrically coupled to ground plane 511 of printed circuit 510 to provide a Faraday cage around the sensor 330, in FIG. 5A. Shielding layer 557 may be coupled to ground plane 511 with a conductive glue (e.g. epoxy) used as connection 560, in some implementations. Shielding layer 557 may be soldered to ground plane 511 for connection 560, in some implementations.

Multi-layer shield 550 also includes optional additional light-blocking layer 558, in the implementation of FIG. 5A. To the extent that shielding layer 557 is reflective or shiny, additional light-blocking layer 558 may assist in reducing or eliminating undesirable reflections. Additional light-blocking layer 558 may be non-conductive. Additional light-blocking layer 558 may include black paint to absorb ambient light to prevent ambient light from becoming incident on sensor 330 or lens assembly 435. The black paint may be applied as an electrodeposited coating or using electrophoresis, or electrospray, for example. Additional light-blocking layer 558 may be configured to block ultraviolet light, visible light, and near-infrared light. Additional light-blocking layer 558 may include an interference layer that selectively transmits or reflects the ambient light as a mechanism to block ambient light from becoming incident on sensor 330 or lens assembly 435. The interference layer may be tuned to block visible light and/or certain wavelengths of infrared light.

In some embodiments the outer-most layer can be used to improve reliability of the conductive coating and can be transparent or have a filler material to increase light blocking.

While multi-layer shield 550 may cover a significant portion of camera module 500, aperture 580 is not coated with multi-layer shield 550 so that image light can still propagate to sensor 330. Aperture 580 may be masked when multi-layer shield 550 is applied, in some implementations.

Figure 5B:
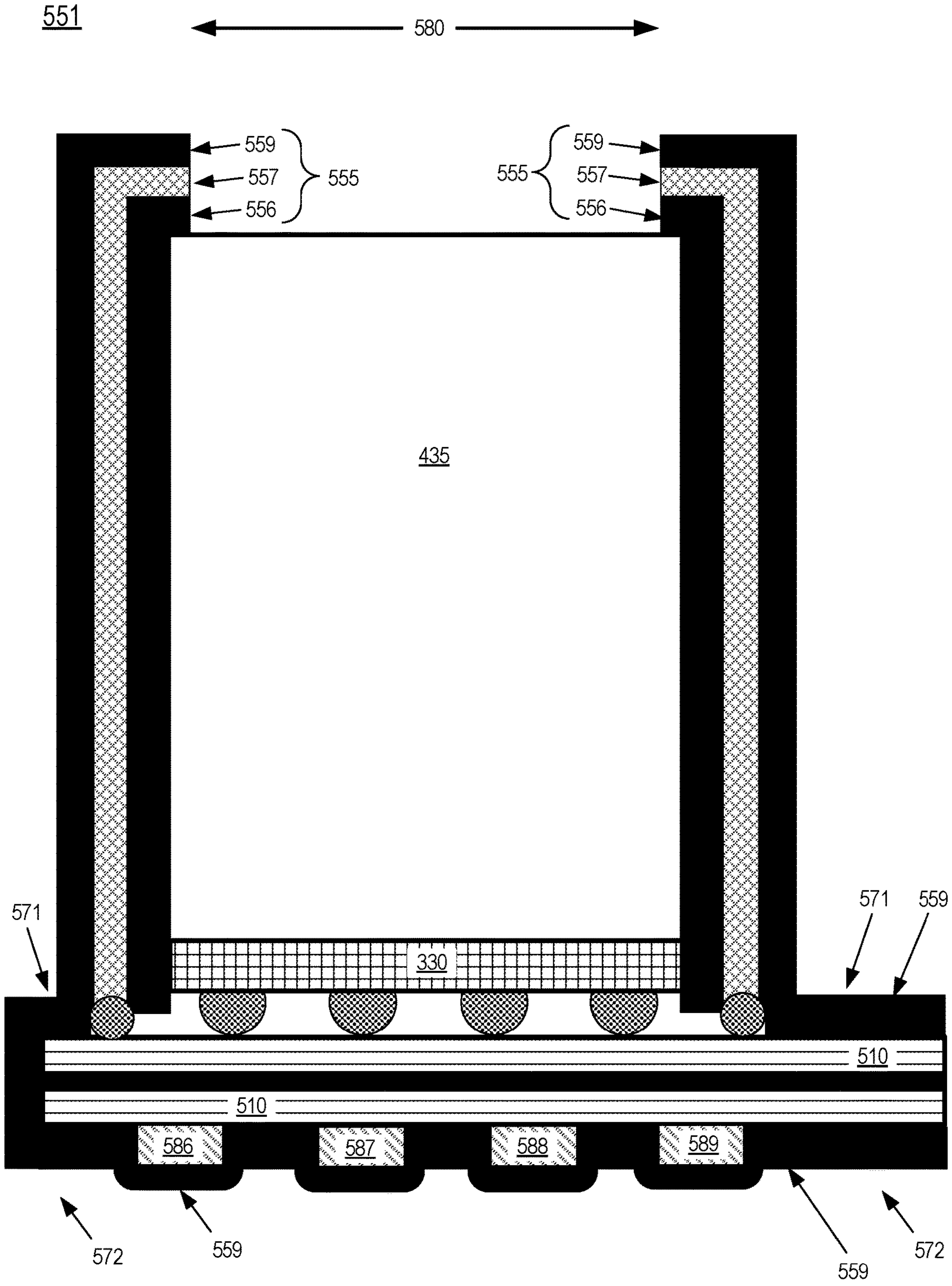
FIG. 5B illustrates a camera module including a multi-layer shield having a light-blocking layer serving to cover electrical components on a backside of a printed circuit, in accordance with aspects of the disclosure.

FIG. 5B illustrates a camera module 551 including a multi-layer shield 555 having a light-blocking layer 559 serving to cover electrical components on a backside of printed circuit 510, in accordance with aspects of the disclosure. Thus, one difference between camera module 500 and camera module 551 is that a light-blocking layer serves as both a fill layer for electrical components and a light-blocking layer for sensor 330 and lens assembly 435.

Electrical components 586, 587, 588, and 589 are disposed on a backside 572 of printed circuit 510 while sensor 330 is disposed on a frontside 571 of printed circuit 510 that is opposite the backside 572. Electrical components 586, 587, 588, and 589 may be passive electrical components (e.g. capacitors, inductors, or resistors) that support image sensor 330. Light-blocking layer 559 may serve as a fill layer that covers the electrical components and/or fills between the electrical components to provide mechanical rigidity to camera module 551. Lens elements of lens assembly 435 may be self-supporting and a light-blocking layer of multi-layer shield 555 may be be coated directly on the lens elements of lens assembly 435.

Figure 5C:
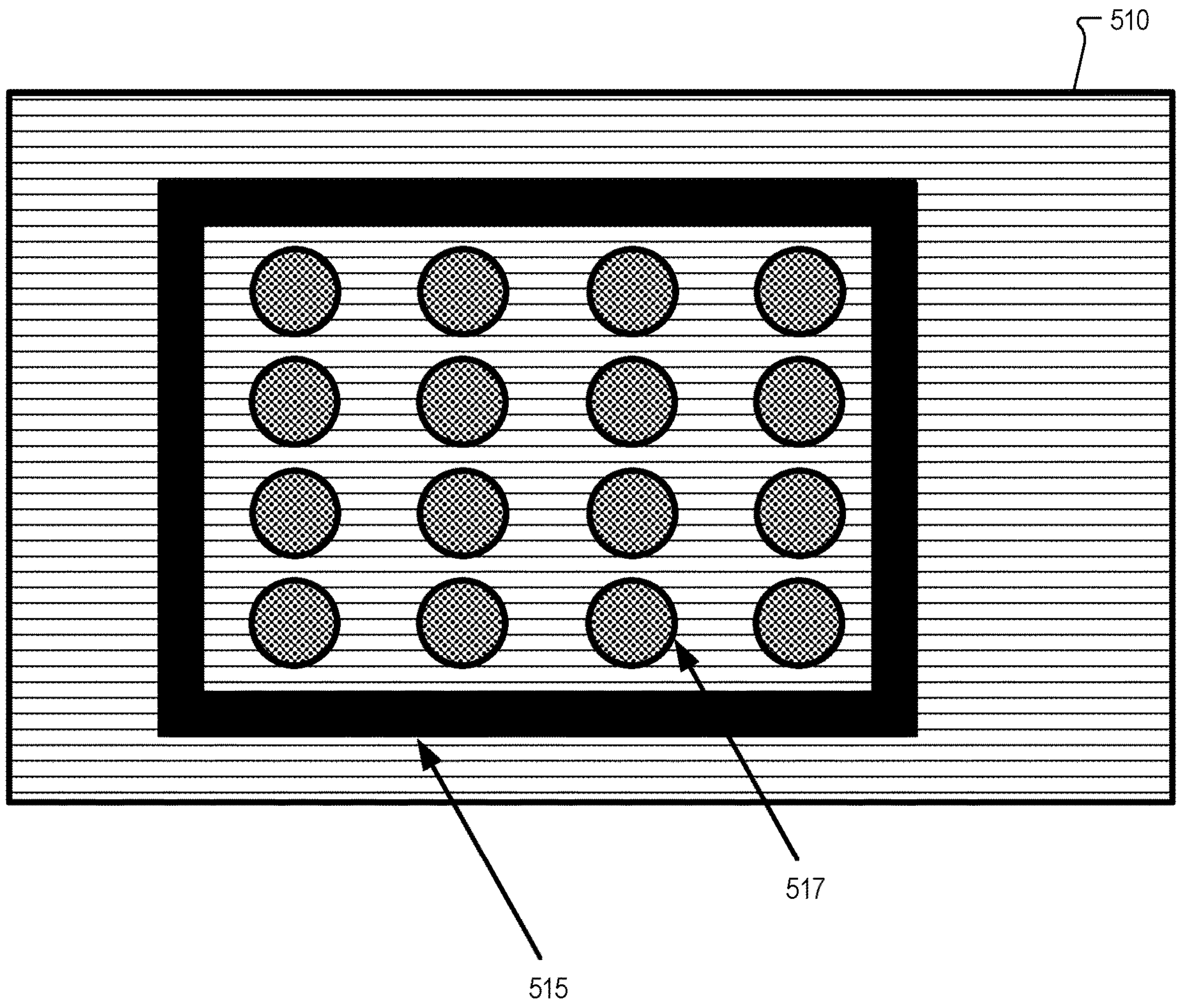
FIG. 5C illustrates a plan view of a portion of a printed circuit, in accordance with aspects of the disclosure.

FIG. 5C illustrates a plan view of a portion of printed circuit 510, in accordance with aspects of the disclosure. Printed circuit 510 includes pads 517 to electrically couple with contacts 470 of sensor 330. Printed circuit 510 also includes a metal track 515 sized to tie in shielding layer 557 of multi-layer shield 550. Metal track 515 may be electrically coupled to ground plane 511 of the printed circuit 510. Metal track 515 may form a closed loop to enhance the Faraday cage effect provided by the combination of shielding layer 557, connection 560 (e.g. conductive epoxy), metal track 515, and ground plane 511. Metal track 515 may be formed of copper and shielding layer 557 may be soldered to the copper of metal track 515.

Figure 5D:
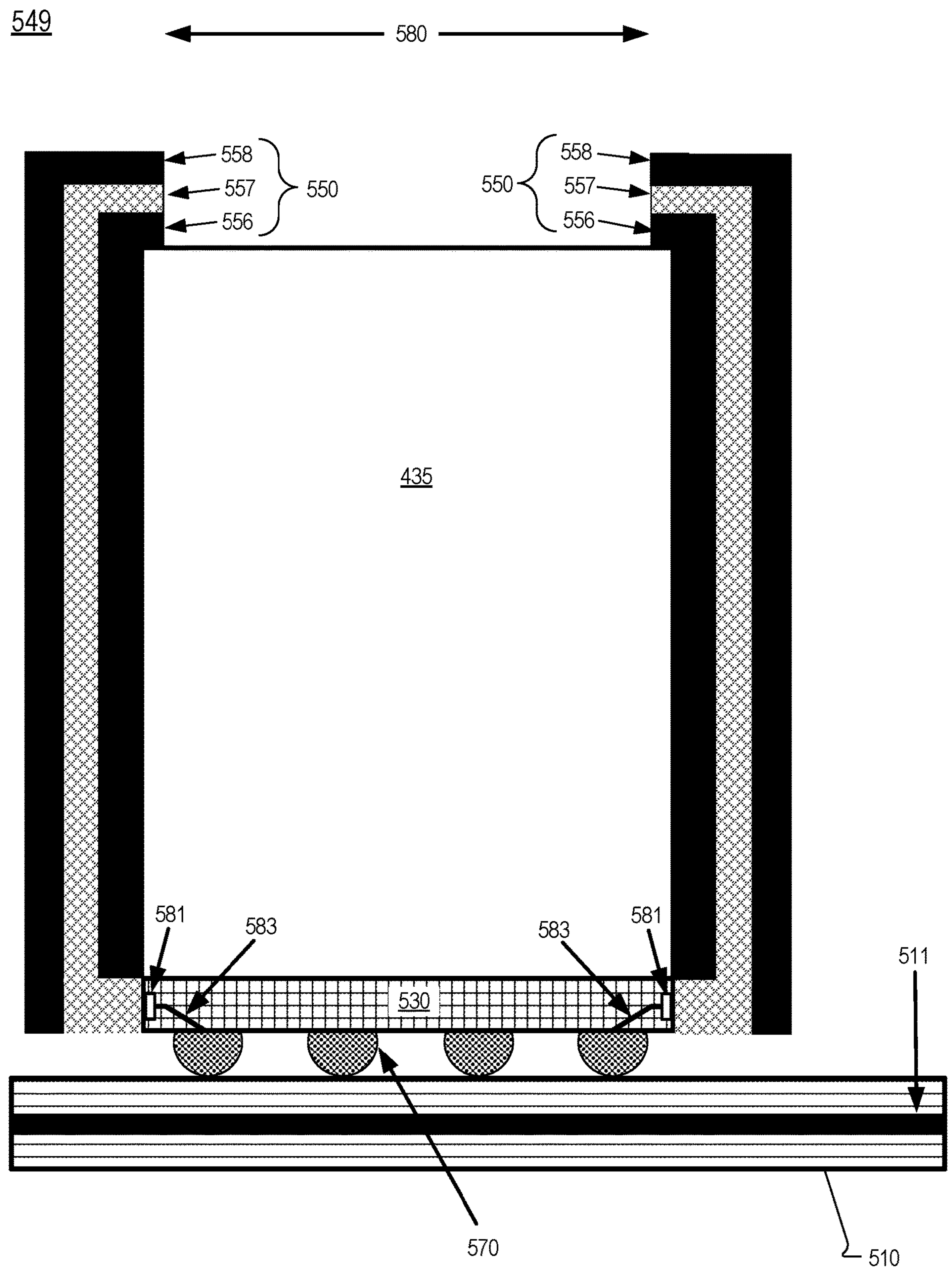
FIG. 5D illustrates a camera module including a shielding layer electrically coupled to a ground plane by way of internal traces and edge plates of an image sensor, in accordance with aspects of the disclosure.

FIG. 5D illustrates a camera module 549 including shielding layer 557 electrically coupled to ground plane 511 by way of internal traces and edge plates of image sensor 530, in accordance with implementations of the disclosure. FIG. 5D differs from FIG. 5A in that connections 560 are no longer used to couple shielding layer 557 to ground plane 511. Rather, image sensor 530 includes edge plates 581, internal traces 583 and the shielding layer 557 is electrically coupled to ground plane 511 by way of edge plates 581, internal traces 583, and conductive contacts 570 of sensor 530. Edge plates 581 may be contact pads disposed on the exterior of a package of sensor 530 to be electrically connected to shielding layer 557. Internal traces 583 may be copper traces that internally traverse the package of sensor 530 from edge plates 581 to conductive contacts 570 of sensor 530.

Figure 6A:
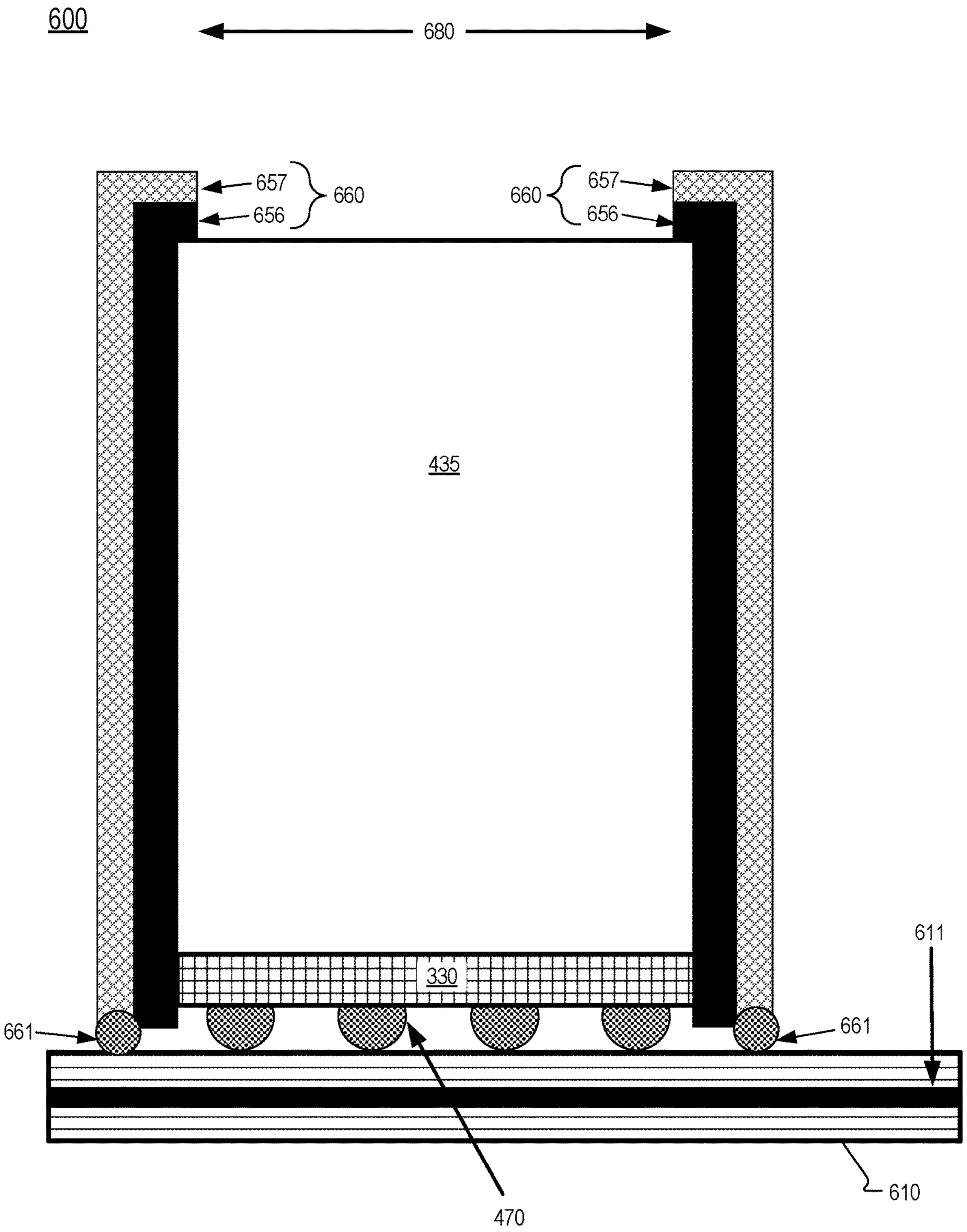
FIG. 6A illustrates a camera module including a multi-layer shield, in accordance with aspects of the disclosure.

FIG. 6A illustrates a camera module 600 including a multi-layer shield 660, in accordance with aspects of the disclosure. Camera module 600 includes sensor 330 and lens assembly 435. Lens assembly 435 may include barrel-less lens assembly 335 having external walls 340, in some implementations. Lens elements of lens assembly 435 may be self-supporting and a light-blocking layer of multi-layer shield 660 may be be coated directly on the lens elements of lens assembly 435. Lens assembly 435 is configured to focus image light to sensor 330.

In FIG. 6A, sensor 330 is electrically coupled to printed circuit 610 via contacts 470. Contacts 470 may be part of a ball grid array. Contacts 470 may be metal. Contacts 470 may be gold-plated. Contacts 470 may be soldered to pads of printed circuit 510. Contacts 470 may include solder balls. The pads of printed circuit 610 may be copper, in some implementations. Printed circuit 610 may be a rigid printed circuit board (PCB) or a flexible circuit (also known as a "flex circuit"). Printed circuit 610 may include a ground plane 611 as a layer of the printed circuit 610. Contacts 470 may be coupled to ground plane 611 with vias (not specifically illustrated) of printed circuit 610.

In FIG. 6A, multi-layer shield 660 is applied to external walls of lens assembly 435. In the illustration of FIG. 6A, multi-layer shield 660 is also applied to the outside of sensor 330.

Figure 6B:
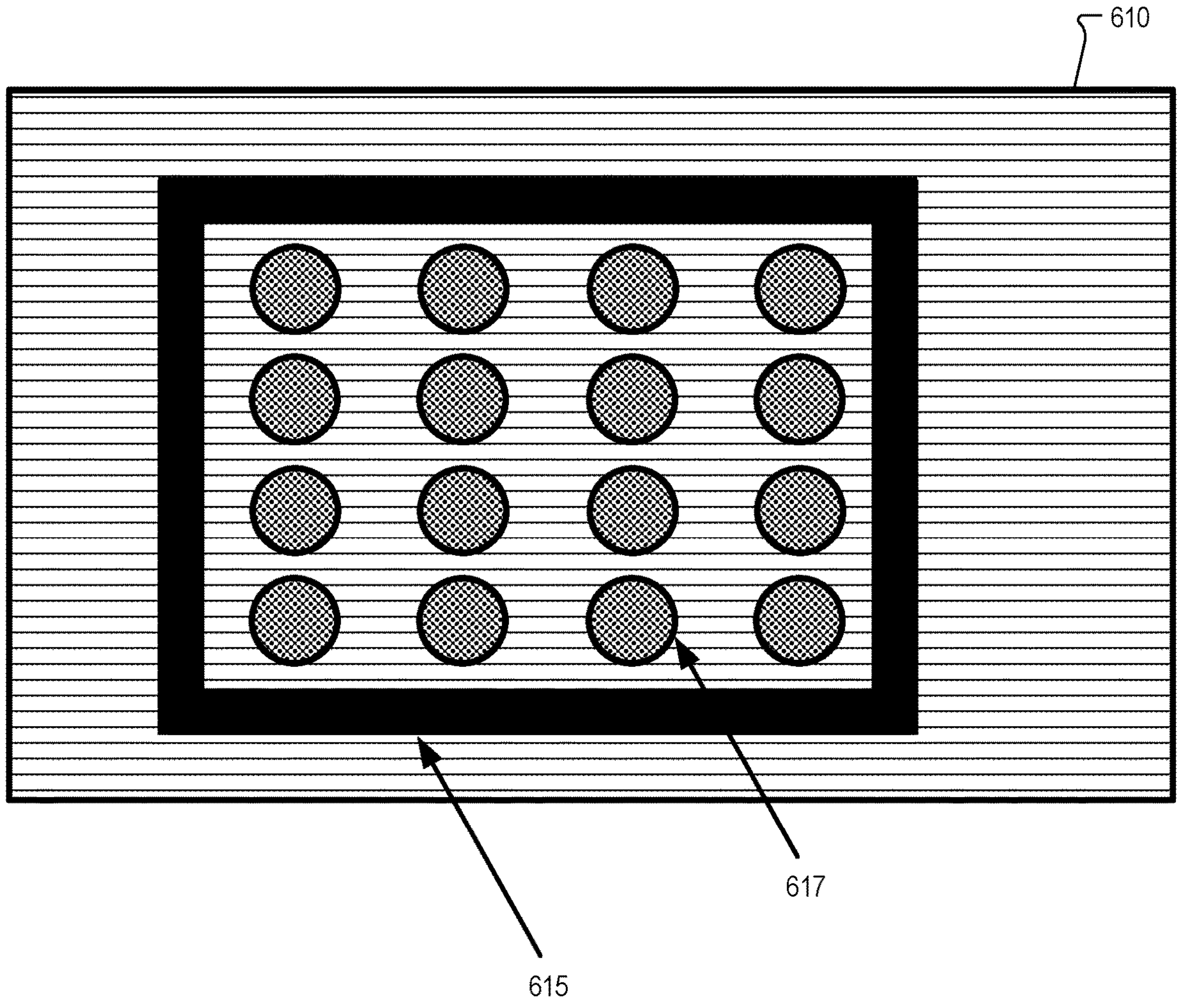
FIG. 6B illustrates a plan view of a portion of a printed circuit, in accordance with aspects of the disclosure.

Multi-layer shield 660 includes layers 656 and 657, in the illustration of FIG. 6B. In an implementation, layer 656 is a black light-blocking layer. Light-blocking layer 656 may include black paint to absorb ambient light to prevent ambient light from becoming incident on sensor 330 or lens assembly 435. Black paint may be applied as an electrodeposited coating or using electrophoresis, or electrospray, for example. Light-blocking layer 656 may be configured to block ultraviolet light, visible light, and near-infrared light. Light-blocking layer 656 may include an interference layer that selectively transmits or reflects the ambient light as a mechanism to block ambient light from becoming incident on sensor 330 or lens assembly 435. The interference layer may be tuned to block visible light and/or certain wavelengths of infrared light.

In an implementation, layer 657 is a shielding layer and an anti-reflective (AR) coating configured to reduce reflections. In an implementation, layer 657 includes chromium oxide that functions as both a shielding layer that blocks EMI as well as an AR absorption coating. Chromium oxide is an electrically conductive compound.

FIG. 6B illustrates a plan view of a portion of printed circuit 610, in accordance with aspects of the disclosure. Printed circuit 610 includes pads 617 to electrically couple with contacts 470 of sensor 330. Printed circuit 610 also includes a metal track 615 sized to tie in shielding layer 657 of multi-layer shield 660. Metal track 615 may be electrically coupled to ground plane 611 of the printed circuit 610. Metal track 615 may form a closed loop to enhance the Faraday cage effect provided by the combination of shielding layer 657, connection 661 (e.g. conductive epoxy), metal track 615, and ground plane 611. Metal track 615 may be formed of copper and shielding layer 657 may be soldered to the copper of metal track 615.

Figure 6C:
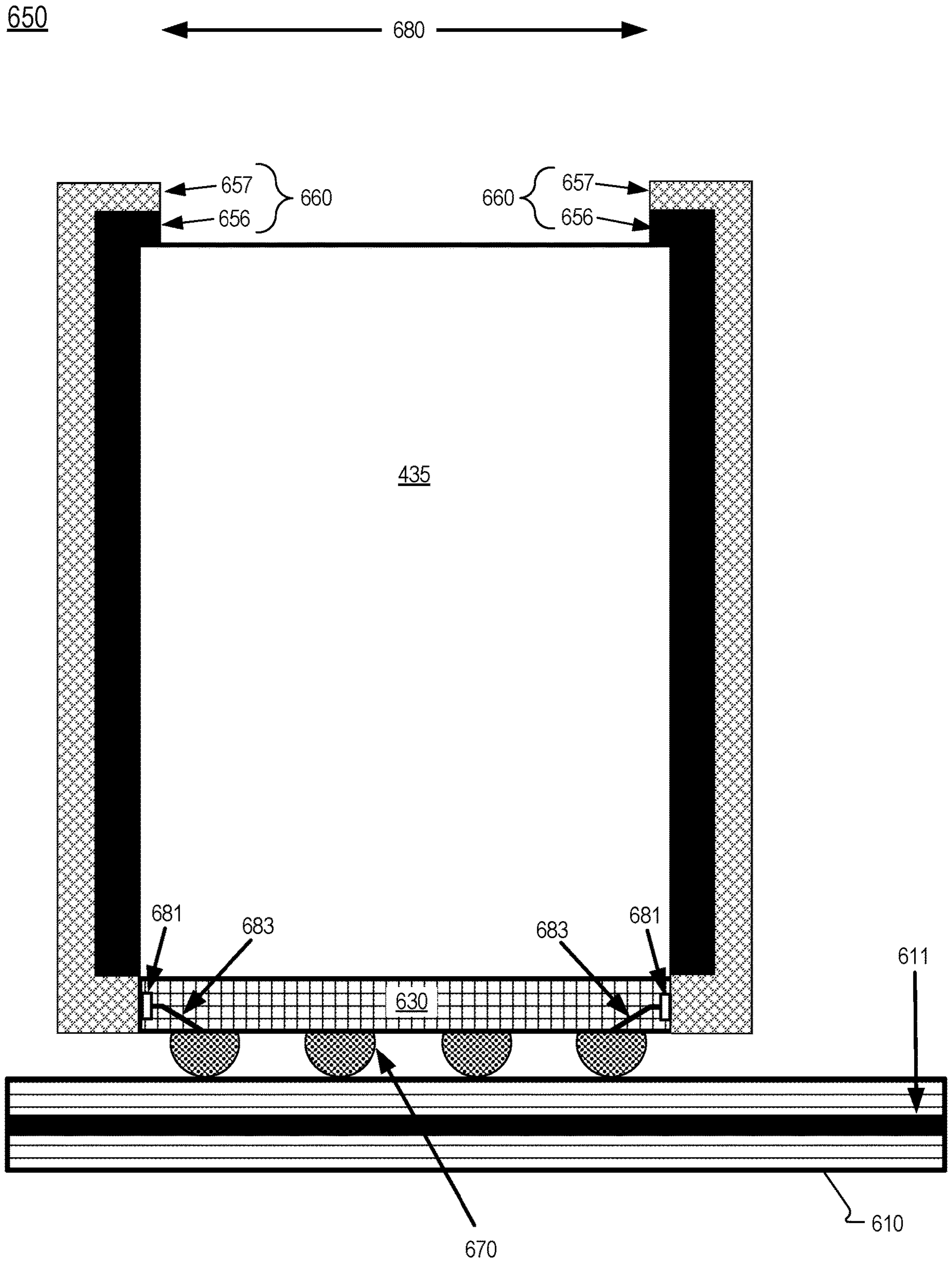
FIG. 6C illustrates a camera module including a shielding layer electrically coupled to a ground plane by way of internal traces and edge plates of image sensor, in accordance with aspects of the disclosure.

FIG. 6C illustrates a camera module 650 including shielding layer 657 electrically coupled to ground plane 611 by way of internal traces and edge plates of image sensor 630, in accordance with implementations of the disclosure. FIG. 6C differs from FIG. 6A in that connections 661 are no longer used to couple shielding layer 657 to ground plane 611. Rather, image sensor 630 includes edge plates 681, internal traces 683 and the shielding layer 657 is electrically coupled to ground plane 611 by way of edge plates 681, internal traces 683, and conductive contacts 670 of sensor 630. Edge plates 681 may be contact pads disposed on the exterior of a package of sensor 630 to be electrically connected to shielding layer 657. Internal traces 683 may be copper traces that internally traverse the package of sensor 630 from edge plates 681 to conductive contacts 670 of sensor 630.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term “processing logic” (e.g. processing logic 107) in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A “memory” or “memories” described in this disclosure may include one or more volatile or non-volatile memory architectures. The “memory” or “memories” may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Networks may include any network or network system such as, but not limited to, the following: a peer-to-peer network; a Local Area Network (LAN); a Wide Area Network (WAN); a public network, such as the Internet; a private network; a cellular network; a wireless network; a wired network; a wireless and wired combination network; and a satellite network.

Communication channels may include or be routed through one or more wired or wireless communication utilizing IEEE 802.11 protocols, short-range wireless protocols, SPI (Serial Peripheral Interface), I2C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. “the Internet”), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit (“ASIC”) or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A camera module comprising:

a printed circuit;

an image sensor;

a lens assembly configured to focus image light to the image sensor; and a multi-layer shield disposed around the lens assembly and around the image sensor, wherein the multi-layer shield includes:

a shielding layer configured to block electromagnetic interference (EMI), wherein the shielding layer includes conductive material; and a light-blocking layer configured to block ambient light from becoming incident on the image sensor and the lens assembly, wherein the light-blocking layer is disposed around the lens assembly and around the image sensor.

2. The camera module of claim 1, wherein the lens assembly is barrel-less, and wherein the light-blocking layer is coated directly on lens elements of the lens assembly.

3. The camera module of claim 1, wherein lens elements of the lens assembly are self-supporting, and wherein the light-blocking layer is coated directly on the lens elements of the lens assembly.

4. The camera module of claim 1, wherein the light-blocking layer absorbs the ambient light that includes ultraviolet light, visible light, and infrared light.

5. The camera module of claim 1, wherein the light-blocking layer includes an interference layer that selectively transmits or reflects the ambient light.

6. The camera module of claim 1, wherein the shielding layer includes at least one of acrylic conductive paint, conductive epoxy, conductive urethane, or conductive acrylic-urethane.

7. The camera module of claim 1 further comprising:

an additional light-blocking layer, wherein the shielding layer is disposed between the light-blocking layer and the additional light-blocking layer, and wherein the light-blocking layer is disposed on the lens assembly.

8. The camera module of claim 7, wherein the additional light-blocking layer also covers capacitors or resistors on a backside of the printed circuit, the backside of the printed circuit opposite a frontside of the printed circuit where the image sensor is disposed.

9. The camera module of claim 1, wherein the shielding layer is coupled to a ground plane of the printed circuit to provide a Faraday cage around the image sensor.

10. The camera module of claim 9, wherein the printed circuit includes a metal track sized to tie in the shielding layer, wherein the metal track is electrically coupled to a ground plane of the printed circuit.

11. The camera module of claim 10, wherein the image sensor includes edge plates, internal traces, and conductive contacts coupled to the printed circuit, and wherein the shielding layer is electrically coupled to the ground plane by way of the edge plates, internal traces, and conductive contacts of the image sensor.

12. The camera module of claim 10, wherein the metal track is formed of copper, and wherein the shielding layer is soldered to the copper of the metal track.

13. The camera module of claim 10, wherein conductive glue couples the metal track to the shielding layer.

14. The camera module of claim 10, wherein a metal coating couples the metal track to the shielding layer.

15. The camera module of claim 1, wherein the printed circuit is a printed circuit board or a flexible circuit board.

16. The camera module of claim 1, wherein the shielding layer is also an anti-reflective (AR) coating or an absorption coating.

17. The camera module of claim 16, wherein the shielding layer includes chromium oxide.

18. The camera module of claim 1, wherein the lens assembly includes a filter layer, and wherein the multi-layer shield is disposed on the filter layer included in the lens assembly.

19. A wearable comprising:

a flexible circuit;

an image sensor disposed on the flexible circuit;

a barrel-less lens assembly configured to focus image light to the image sensor; and a multi-layer shield disposed on lens elements of the barrel-less lens assembly and around the image sensor, wherein the multi-layer shield includes:

a shielding layer configured to block electromagnetic interference (EMI), wherein the shielding layer includes conductive material; and a light-blocking layer configured to block ambient light from becoming incident on the image sensor and the barrel-less lens assembly.

20. A lens assembly comprising:

self-supporting lens elements configured to focus image light to an image sensor; and a multi-layer shield coated directly on the self-supporting lens elements, wherein the multi-layer shield includes:

a shielding layer configured to block electromagnetic interference (EMI), wherein the shielding layer includes conductive material;

a light-blocking layer configured to block ambient light from becoming incident on the image sensor and the lens assembly; and a non-light blocking layer, wherein the shielding layer is disposed between the light-blocking layer and the non-light blocking layer, and wherein the light-blocking layer is disposed between the self-supporting lens elements and the shielding layer.

* * * * *